United States Patent [19]

Yokoyama

[11] 4,151,477
[45] Apr. 24, 1979

[54] TONE CONTROL CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 835,926

[22] Filed: Sep. 23, 1977

[30] Foreign Application Priority Data

Sep. 25, 1976 [JP] Japan .................................. 51-115207

[51] Int. Cl.² ........................................... H03F 1/34
[52] U.S. Cl. ................................. 330/107; 330/109; 330/294; 333/28 T
[58] Field of Search ............... 330/107, 109, 294, 304; 333/28 T; 179/1 D, 100.1 TC; 325/424

[56] References Cited

U.S. PATENT DOCUMENTS

| | | | |
|---|---|---|---|
| 3,059,190 | 10/1962 | Hafler | 330/92 |
| 3,566,294 | 2/1971 | Takahashi | 330/293 |
| 3,683,293 | 8/1972 | Matsui | 330/293 X |

FOREIGN PATENT DOCUMENTS 2243608  10/1973  Fed. Rep. of Germany .......... 330/107

*Primary Examiner*—James B. Mullins
*Attorney, Agent, or Firm*—Sughrue, Rothwell, Mion, Zinn and Macpeak

[57] ABSTRACT

A tone control circuit for stereophonic amplifiers, guitar amplifiers and the like is disclosed. The tone control circuit includes a bass circuit having a first variable resistor whose movable contact is connected to an output terminal of an amplifier circuit, two resistors equal in resistance connected respectively to two end terminals of the variable resistor, and a capacitor shunting the variable resistor. The tone control circuit also includes a treble circuit having a second variable resistor, a resistor, and a capacitor. The treble circuit is connected in parallel to the bass circuit in such a manner that the gain in a particular frequency range of the amplifier circuit can be changed by varying the resistances of the two variable resistors.

4 Claims, 16 Drawing Figures

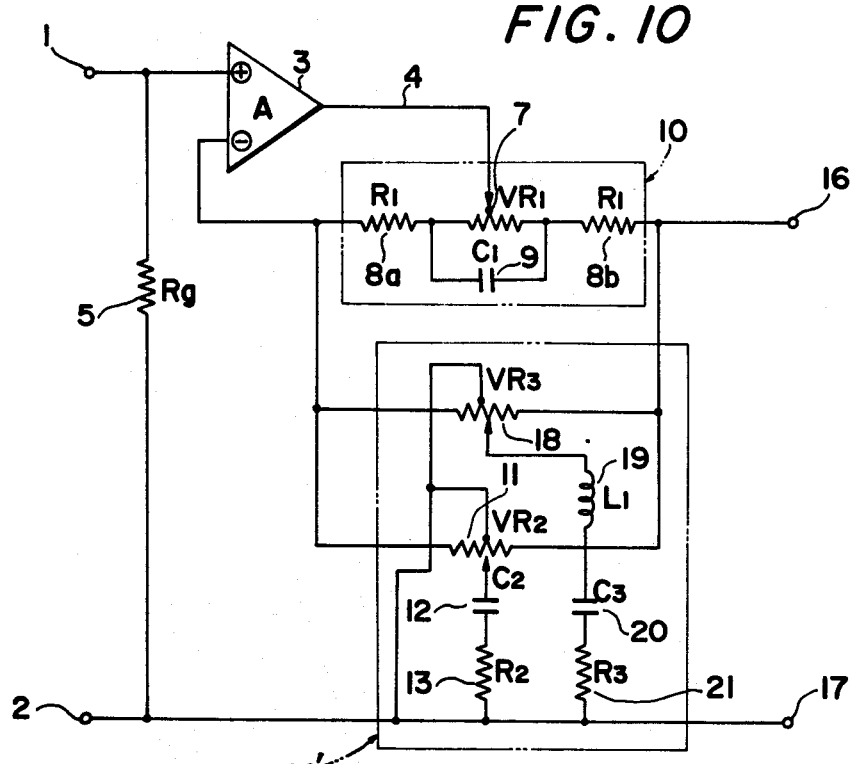
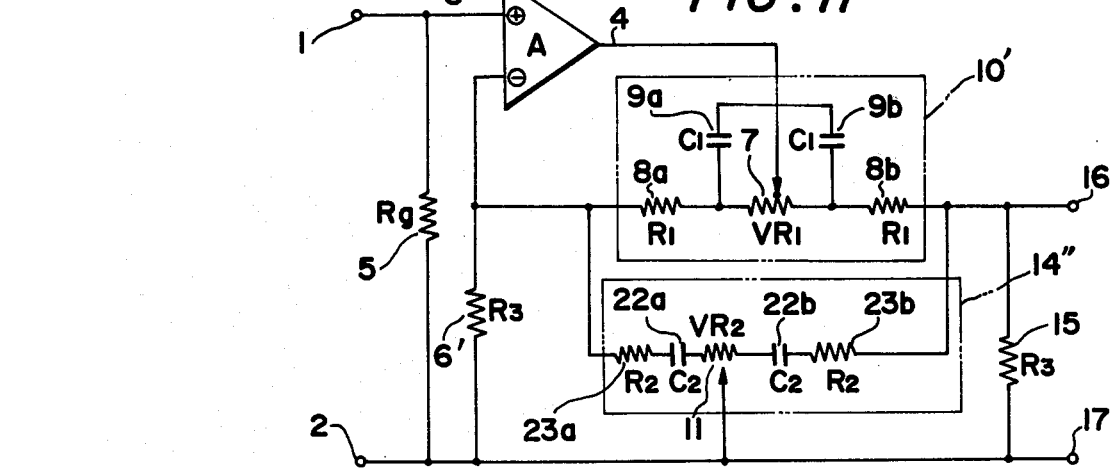
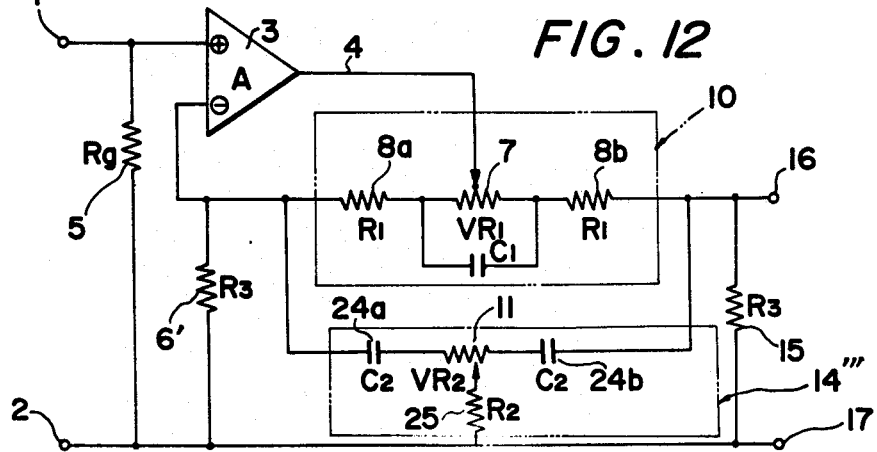

TONE CONTROL CIRCUIT

BACKGROUND OF THE INVENTION

This invention relates to tone control circuits employed in stereophonic amplifiers, guitar amplifiers, and so forth.

Heretofore, so-called tone control circuits of the CR type, the NF (or negative feedback) type, or the BAX type are well known in the art as tone control circuits in stereophonic amplifiers. However, the tone control circuit of the CR type has a certain amount of loss in general, and suffers from drawbacks that is necessary to provide an amplifier with low output impedance to drive the tone control circuit and it is difficult to obtain a flat frequency response characteristic. On the other hand, the tone control circuit of the NF type does not require a low impedance driver amplifier. Instead, this type tone control circuit employs a voltage feedback circuit designed to have a desired frequency response characteristic to provide the required tone control. However, the NF type tone control circuit also surfaces from drawbacks. Specifically, its manufacturing cost is relatively high, or it is not economical, because it requires special variable resistors and switches. Since the tone control circuit of the BAX type or the BAX modification type needs two amplifiers, it is disadvantageous in that its circuit is relatively intricate.

Furthermore, known in the art is a tone control circuit disclosed in U.S. Pat. No. 3,683,293 assigned to the same assignee with the present application. This tone control circuit comprises a treble circuit made up of an amplifier circuit with first and second output terminals through which outputs of opposite phases to each other are provided, a first variable resistor connected between the first and second output terminals of the amplifier circuit and having a movable contact grounded, and a series circuit of a resistor and a capacitor connected to the variable resistor. There is further provided a bass circuit made up of a second variable resistor connected between the two output terminals of the aforementioned amplifier circuit and having its movable contact grounded, a capacitor with its one terminal connected to the variable resistor and the other terminal grounded, and resistors connected in series to the variable resistor. In this tone control circuit, the ratio of the load impedance on the first output terminal side to the load impedance on the second output terminal side is varied by varying the resistances of the first and second variable resistors in order to vary the gain in a particular frequency range. However, tone control circuit is disadvantageous in that its manufactuing cost is relatively high.

SUMMARY OF THE INVENTION

Accordingly, an object of this invention is to overcome the above-described drawbacks accompanying conventional tone control circuits.

More specifically, an object of the invention is to provide a tone control circuit which does not require a low impedance driver amplifier. Another object of the invention is to provide a tone control circuit which attains high signal to noise (S/N) ratio.

Still another object of the invention is to provide a tone control circuit which is relatively simple in circuit contiguration and economical to manufacture.

These objects are accomplished by providing a tone control circuit comprising a bass circuit which comprises a first variable resistor whose movable contact is connected to the output of an amplifier circuit, two resistors connected respectively to both end terminals of the first variable resistor, the two resistors being equal in resistance to each other, and a capacitor connected in parallel to the first variable resistor; and a treble circuit having a second variable resistor, a resistor, and a capacitor, the treble circuit being connected in parallel to said bass circuit, whereby the gain in a particular frequency range of the amplifier circuit is changed by varying the resistances of the first and second variable resistors.

The invention, as well as other objects and advantages thereof, will be best understood by reference to the following detailed description of illustrative embodiments, when read in conjunction with the accompanying drawings, in which like parts are designed by like reference numerals or characters.

BRIEF DESCRIPTION OF THE DRAWINGS

In the accompanying drawings:

FIGS. 8 through 13 are schematic circuit diagram showing second through seventh examples of the tone control circuit according to this invention, respectively;

DETAILED DESCRIPTION OF THE INVENTION

A variety of examples of a tone control circuit according to this invention will be described with reference to the accompanying drawings.

Figure 1:
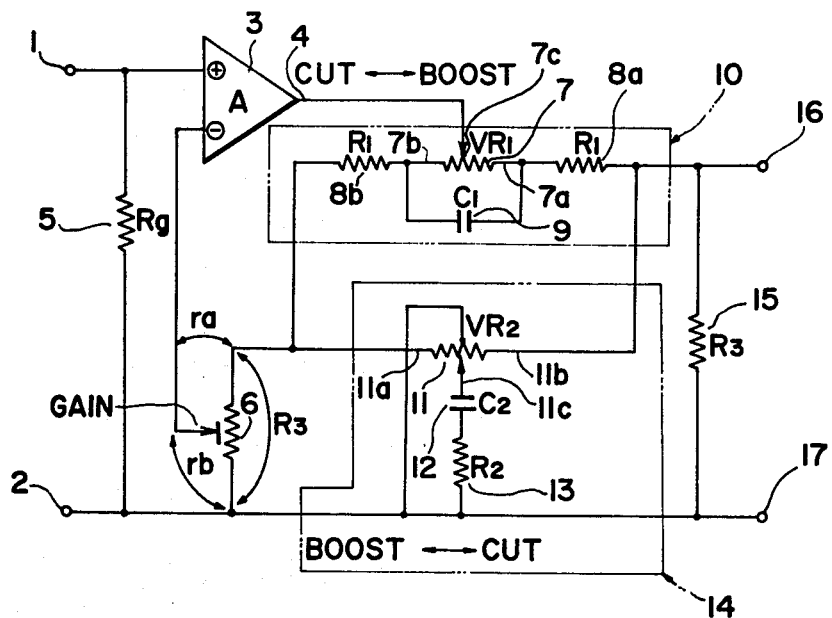
FIG. 1 is a schematic circuit diagram illustrating a first example of a tone control circuit according to this invention.
Figure 2:
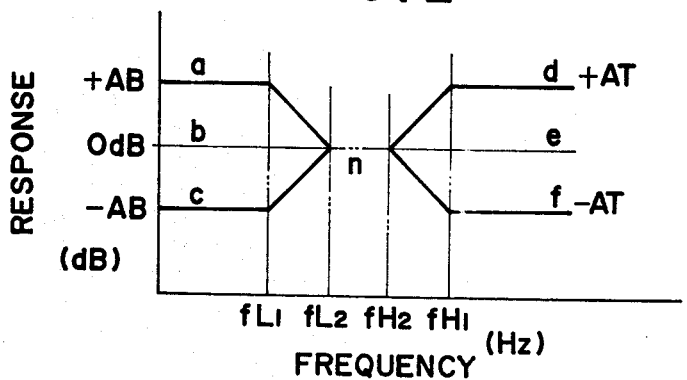
FIG. 2 is a graphical representation indicating operating characteristic curves of the tone control circuit shown in FIG. 1.

A first example of the tone control circuit is shown in FIG. 1. The frequency response characteristics of the first example are indicated in FIG. 2. As illustrated in FIG. 1, the tone control circuit comprises a non-inversion input terminal 1, a ground terminal 2, and a resistor 5 (whose resistance is Rg) connected between these two terminals 1 and 2. The input terminal 1 is connected to the non-inversion input terminal (+) of an amplifier 3, the inversion input terminal (−) of which is connected to the movable contact of a variable resistor 6 (whose resistance is R3) which, when the frequency response characteristic curve of the tone control circuit is flat, can control the gain. One of the two terminals of the variable resistor 6 is connected to the terminal 2, whereas the other terminal is connected to one terminal of a resistor 8b and to one terminal of a second variable resistor 11 (described later). The tone control circuit further comprises a bass circuit 10 which is made up of a first variable resistor 7 (having a resistance VR1), resistors 8a and 8b connected respectively to the two terminals 7a and 7b of the first variable resistor 7, and a capacitor 9 (whose capacitance is C1) connected in parallel to the first variable resistor 7. The resistance of each resistor 8a and 8b is R1. The movable contact 7c of the variable resistor 7 is connected to the output terminal 4 of the amplifier 3. The other terminal of resistor 8a is connected to an output terminal 16 of the tone control circuit.

Reference numeral 14 designates a treble circuit. The treble circuit 14 is made up of the aforementioned second variable resistor 11 (whose resistance is VR2) connected in parallel to the bass circuit 10 through the terminals 11a and 11b, a capacitor 12 (whose capacitance is C2) connected in series to the movable contact 11c of the variable resistor 11 and a resistor 13 (whose resistance is R2). Both of the center tap of the variable resistor 11 and the other terminal of the resistor 13 are connected to a grounded output terminal 17 of the tone control circuit. A resistor 15 (whose resistance in R3) is connected between the above-described terminals 16 and 17. The terminals 2 and 17 are at the same potential (or the ground potential).

The operation of the tone control circuit thus constructed will be described with reference to FIG. 2.

Figure 3:
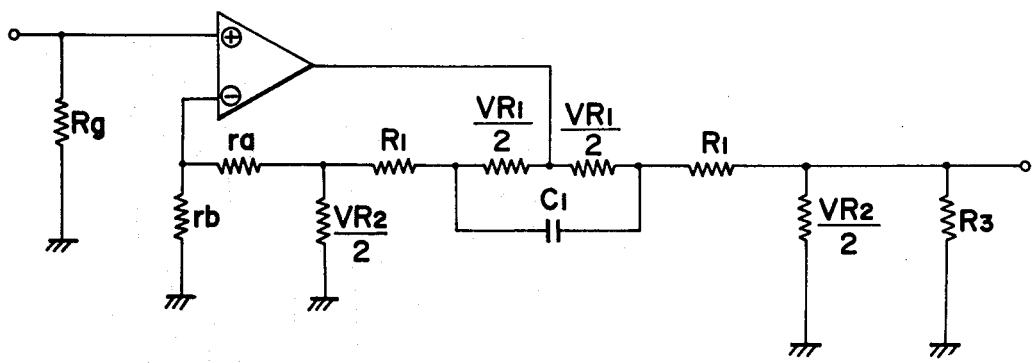
FIG. 3 is an equivalent circuit of the first example with a flat characteristic.

In the case where it is intended to make flat the characteristic curve of the tone control circuit, the movable contacts 7a and 11c of the variable resistors 7 and 11 are set at the centers thereof respectively so that the resistance between the terminals 7a and 7c is equal to the resistance between the terminals 7b and 7c, and the resistance between the terminals 11a and 11c is equal to the resistance between the terminals 11b and 11c. If, in this case, the gain of the amplifier 3 is sufficiently high, the gain Au of the amplifier 3 can be expressed by the following equation (1) based on the equivalent circuit shown in FIG. 3:

$$Au = 1 + \frac{ra}{rb} \quad (1)$$

where ra and rb are the resistance between one terminal of the variable resistor 6 and the movable contact, and the resistance between the other terminal and the movable contact, respectively. Accordingly, if the movable contact of the variable resistor 6 is held at a predetermined position so as to keep the ratio of ra to rb constant, a flat characteristic curve over the entire frequency range, as indicated by a curve b-n-e in FIG. 2, can be obtained.

Figure 4:
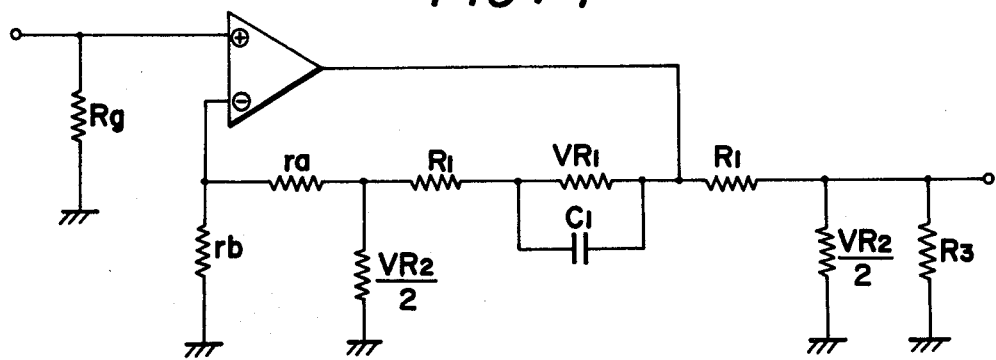
FIGS. 4 through 7 are equivalent circuits of the first example with bass boot, bass cut, treble cut, and treble boost characteristics, respectively.

In the case where it is intended to provide a bass boost characteristic curve, the movable contact 7c of the variable resistor 7 is moved to the side of the terminal 7a. In this case, wherever the movable contact 11c of the variable resistor 11 may be positioned, since the capacitance C2 is sufficiently low in the bass frequency range, the contact 11c is in an open state, and the impedance of the treble circuit 14 as viewed from the amplifier 3 is only VR2/2. In this case, the maximum value $A_B$ of the gain of the amplifier 3 can be represented by the following equation (2) based on the equivalent circuit shown in FIG. 4:

$$A_B = 1 + \frac{VR1}{R1 + R3 \parallel \frac{VR2}{2}}, \quad (2)$$

where $R3 \parallel VR2/2$ means the resistance of the parallel resistances R3 and VR2/2, i.e.

$$R3 \parallel \frac{VR2}{2} = \frac{R3(\frac{VR2}{2})}{R3 + \frac{VR2}{2}}.$$

Thus, a characteristic curve a-n-e indicated in FIG. 2 is obtained. The frequency $f_{L1}$ at which the maximum gain $A_B$ in the bass frequency range starts damping, and the frequency $f_{L2}$ at which the maximum gain $A_B$ damps to 0 db can be represented by the following two equations (3) and (4), respectively:

$$f_{L1} = \frac{1}{2\pi(R1 + R3 \parallel \frac{VR2}{2} + VR1)C1} \quad (3)$$

$$f_{L2} = \frac{1}{2\pi(R1 + R3 \parallel \frac{VR2}{2})C1} \quad (4)$$

Figure 5:
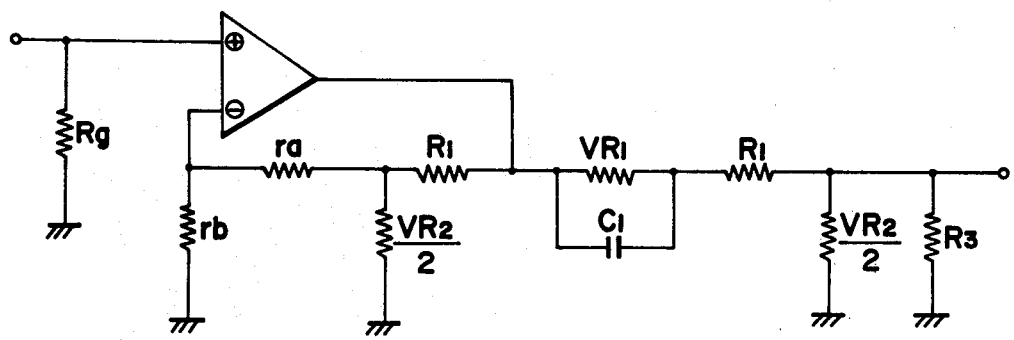

In the case where it is intended to provide a bass cut characteristic curve, the movable contact 7c of the variable resistor 7 is moved to the side of the terminal 7b. In this case, the gain of the amplifier 3 becomes $-A_B$ as is apparent from the equivalent circuit shown in FIG. 5, and a characteristic curve c-n-e indicated in FIG. 2 can be obtained.

Accordingly, the bass characteristic can be continuously changed from the characteristic curve a-n-e to the characteristic curve c-n-e by moving the movable contact 7c from the terminal 7a to the terminal 7b.

In the case where it is intended to obtain a treble boost characteristic, the movable contact 11c of the variable resistor 11 is moved to the side of the terminal 11a. In this case, no matter where the movable contact 7c is positioned, since the capacitance of the capacitor C1 is sufficiently large, in the bass circuit 10 the variable resistor 7 is shorted by the capacitor C1, and the impedance of the bass circuit 10 as viewed from the amplifier 3 depends on the resistance R1 only.

Figure 7:
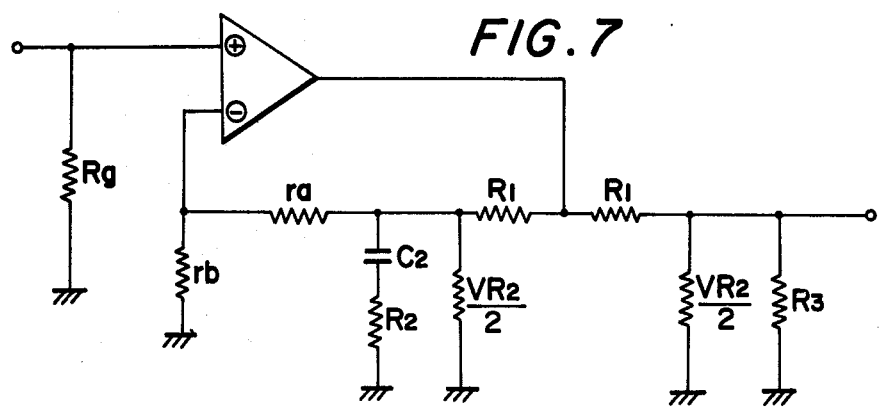

In this case, the maximum value $A_T$ of the gain of the amplifier circuit 3 can be expressed by the following equation (5) based on the equivalent circuit shown in FIG. 7.

$$A_T = 1 + \frac{R1 \parallel R3 \parallel VR2/2}{R2} \quad (5)$$

Accordingly, a characteristic curve b-n-d indicated in FIG. 2 can be obtained. As illustrated in FIG. 2, the frequency $f_{H1}$ at which the maximum gain starts damping and the frequency $f_{H2}$ at which the maximum gain damps to 0 dB are represented by the following two equations (6) and (7), respectively:

$$f_{H1} = \frac{1}{2\pi R2 \cdot C2} \quad (6)$$

$$f_{H2} = \frac{1}{2\pi(R1 \parallel R3 + R2) \cdot C2} \quad (7)$$

Figure 6:
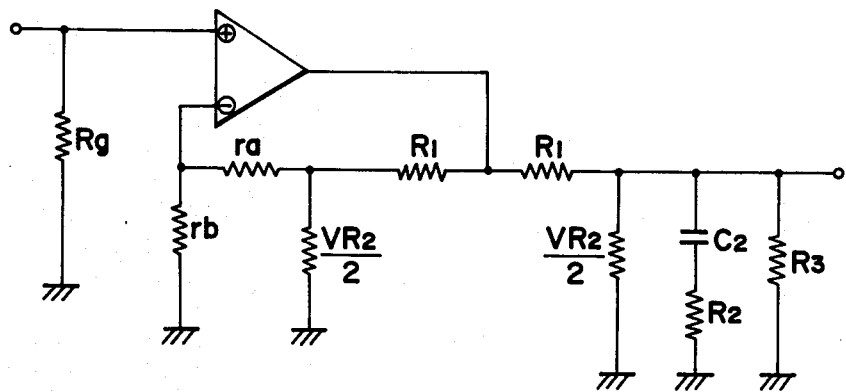

In the case where it is intended to have a treble cut characteristic, the movable contact 11c of the variable resistor 11 is moved towards the terminal 11b. In this case, the gain of the amplifier 3 becomes $-A_T$ as is apparent from the equivalent circuit shown in FIG. 6, and the characteristic curve is b-n-f indicated in FIG. 2. Accordingly, the treble characteristic can be continuously changed from the characteristic curve b-n-d to the characteristic curve b-n-f by moving the movable contact 11c from the terminal 11a to the terminal 11b.

Thus, the characteristic can be optionally selected within a characteristic range defined by the characteristic curves a-n-d and c-n-f by suitably moving the movable contact 7c of the variable resistor 7 and the movable contact 11c of the variable resistor 11.

Figure 8:
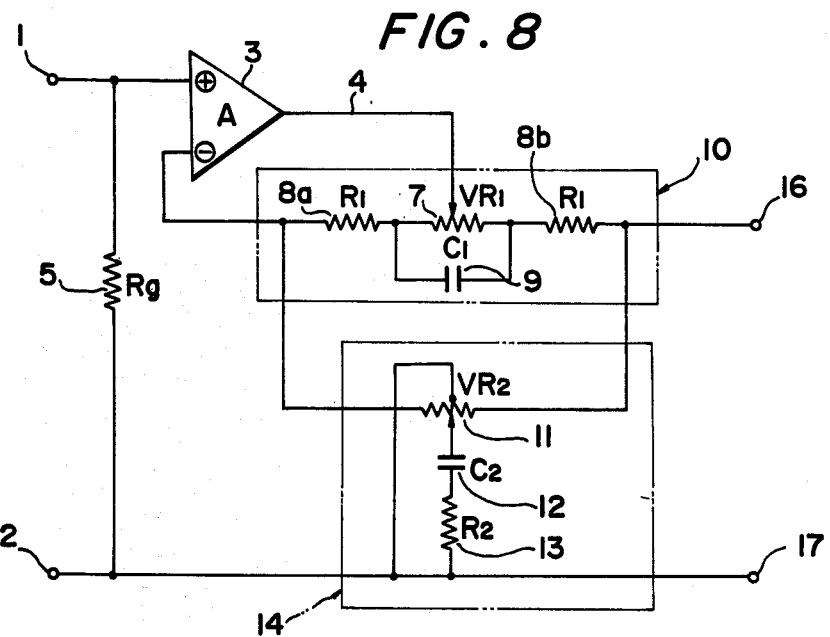

Shown in FIG. 8 is a second example of the tone control circuit according to this invention. The second example is different from the first example shown in FIG. 1 in that the circuitry is simplified by removing the resistors 6 and 15 from the circuit shown in FIG. 1. Accordingly, in both of FIGS. 1 and 8 like parts are designated by like reference numerals or characters. In addition, it should be noted that in various examples also like parts are designated by like reference numerals or characters.

Figure 9:
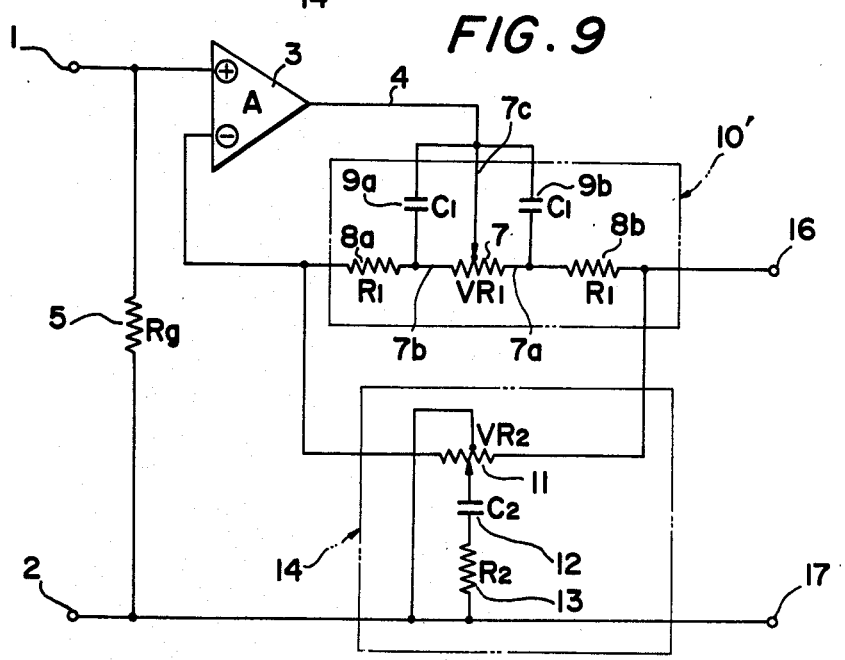

A third example of the tone control circuit is shown in FIG. 9. In this example, two capacitors 9a and 9b (each having a capacitance C1) in a bass circuit 10' are connected between the terminals 7a and 7c and between the terminals 7b and 7c of the variable resistor 7. The other elements are identical in arrangement to those in the second example.

A fourth example of the tone control circuit is shown in FIG. 10. This example is most significantly different from the first example in the treble circuit and the removal of resistor 6. The treble circuit 14' of this example comprises the variable resistor 11, the capacitor 12, and the resistor 13 all of which are included in the circuit shown in the first example, and further comprises a third variable resistor 18 (whose resistance is VR3) connected in parallel to the variable resistor 11, a coil 19 (whose inductance is L1) connected in series to the movable contact of the variable resistor 18, a capacitor 20 (whose capacitance is C3) connected to the coil 19, and a resistor 21 (whose resistance is R3) connected to the capacitor 20. The center tap of the aforementioned variable resistor 18 is connected to the ground terminal 17. Accordingly, this treble circuit 14' can carry out the control of a divided characteristic. In other words, treble boost and treble cut can be provided at two different frequency ranges.

Shown in FIG. 11 is a fifth example of the tone control circuit according to the invention. In this example, a fixed resistor 6' (whose resistance is R3) is provided in place of the variable resistor 6 included in the first example, and the arrangement of the base circuit 10' is identical to that in the above-described third example. However, its treble circuit 14" is different from any of the treble circuits in the first through fourth examples. In other words, the treble circuit 14" in the fifth example comprises a series circuit of a resistor 23a (whose resistance is R2), a capacitor 22a (whose capacitance is C2), the second variable resistor 11, another capacitor 22b (whose capacitance is C2), and another resistor 23b (whose resistance is R2). The movable contact of the aforementioned variable resistor is connected to the ground terminal 17, and the treble circuit 14" is connected in parallel to the base circuit 10'. In addition, the variable resistor 11 does not have a center tap connected to the ground terminal 17. Thus, the treble circuit of the fifth example is different from those of the first through fourth examples.

FIG. 12 illustrates a sixth example of the tone control circuit according to the invention. This example, similarly as in the fifth example, is provided with the resistor 6', and the bass circuit 10 is similar to those of the first, second and fourth examples. However, the treble circuit 14''' of the sixth example is different from those of the first through fifth examples. More specifically, the treble circuit 14''' is made up the second variable resistor 11, two capacitors 24a and 24b (each having a capacitance C2) connected respectively to the two end terminals of the variable resistor 11, and a resistor 25 (whose resistance is R2) connected between the movable contact of variable resistor 11 and the ground terminal 17. The treble circuit 14''' thus organized is connected in parallel to the bass circuit 10. Again, the variable resistor 11 does not have a center tap connected to the ground terminal 17.

Figure 13:
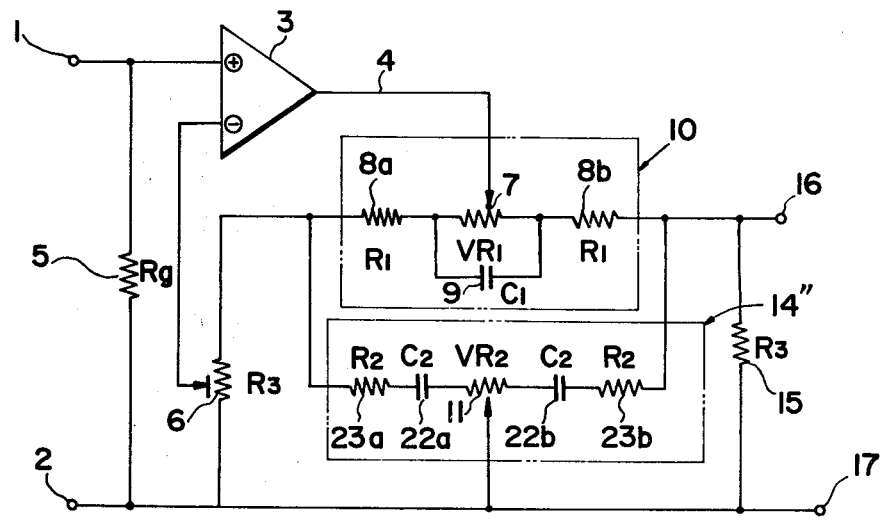

FIG. 13 shows a seventh example of the tone control circuit of this invention. This example can be obtained by replacing the treble circuit 14 in the first example with the treble circuit 14''' in the fifth example.

Figure 14:
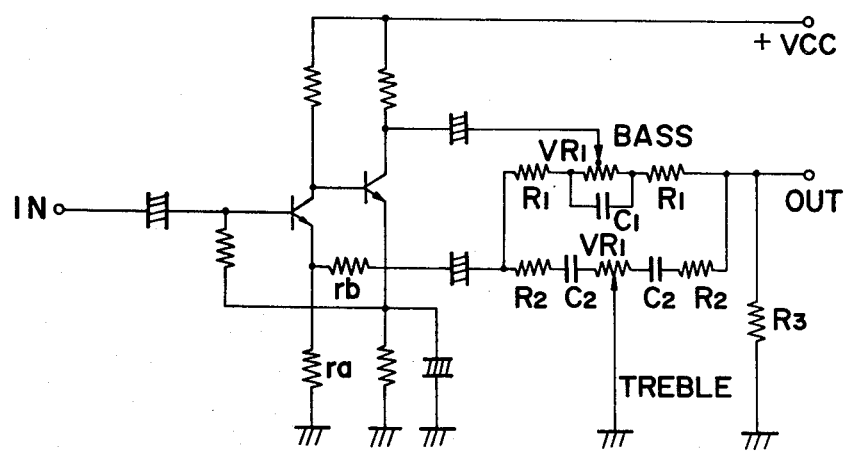
FIG. 14 is a circuit diagram more concretely showing the tone control circuit shown in FIG. 13.
Figure 15:
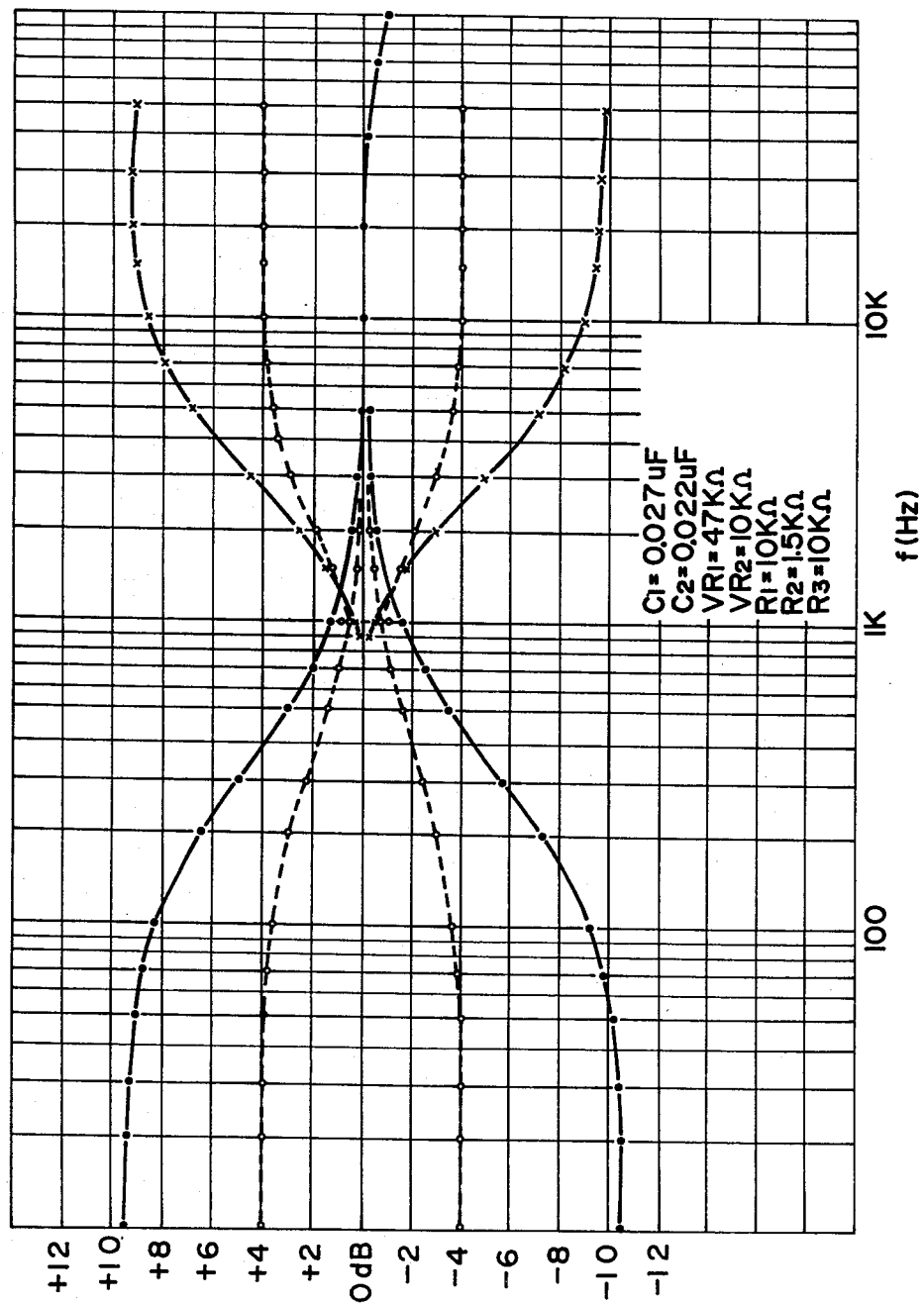
FIG. 15 is a graphical representation indicating actually measured data of the tone control circuit shown in FIG. 14.
Figure 16:
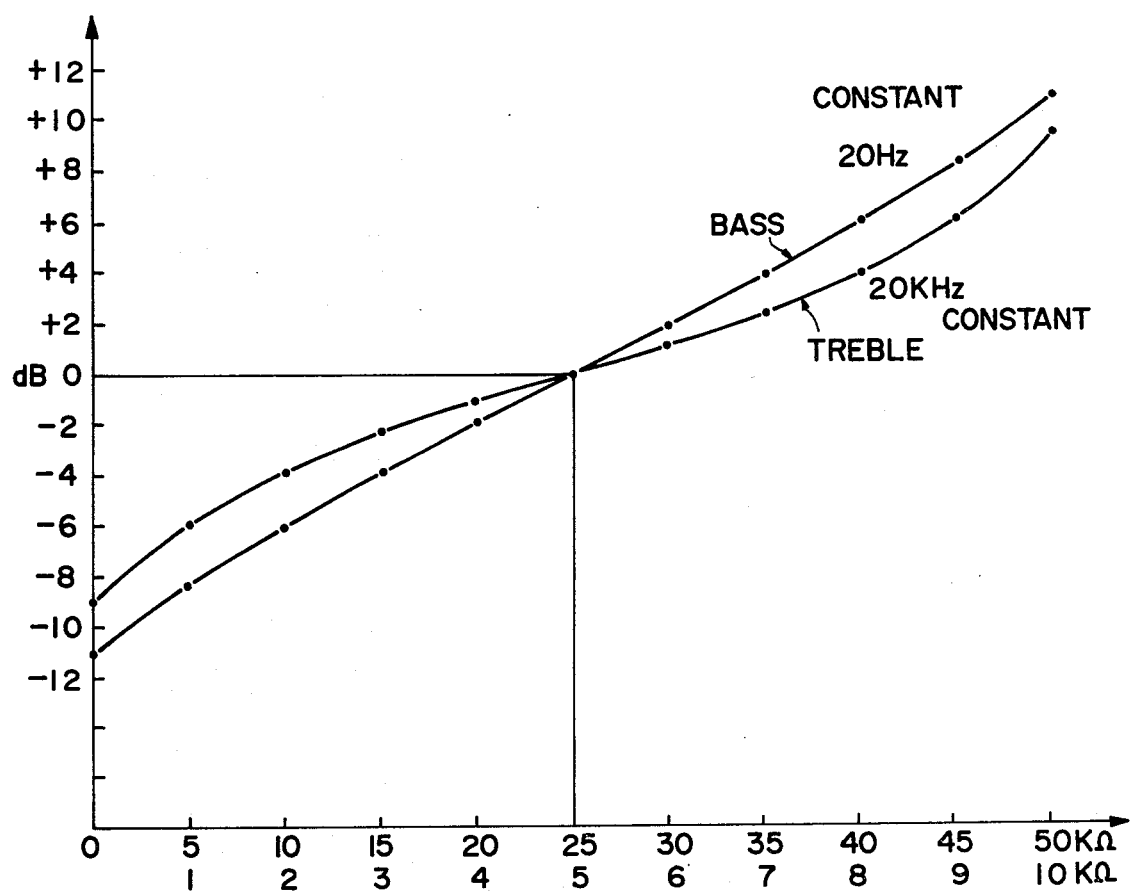
FIG. 16 is also a graphical representation indicating variation characteristic curves of the two variable resistors employed in the tone control circuit shown in FIG. 14.

FIG. 14 shows the tone control circuit of the seventh example more concretely. FIG. 15 is a graphical representation indicating actually measured data of the tone control circuit shown in FIG. 14. FIG. 16 is also a graphical representation indicating variation characteristic curves of the variable resistors 7 and 11.

As is apparent from the above description, in the tone control circuit according to this invention, the movable contact of the first variable resistor forming the bass circuit is connected to the output terminal of the amplifier circuit, and the treble circuit including the second variable resistor is connected in parallel to the aforementioned bass circuit so that the gain control in the particular frequency range is carried out by changing the resistances of the first and second variable resistors. Therefore, the tone control circuit of this invention has a variety of merits such as described below:

The arrangement of the circuit is relatively simple, which leads to a more economical manufacture of the circuit. Since the input impedance is high, unlike the case of the NF type tone control circuit, it is not necessary to make the output impedance of the amplifier low. The S/N ratio is satisfactorily high since the tone control operation is carried out exclusively at the output side of the amplifier so that noise component in the tone-controlled signal is not amplified through the amplifier. As is seen from the actually measureed data indicated in FIG. 5, the variation characteristics are excellent being substantially symmetrical. In the cases where the center tap of the second variable resistor in the treble circuit is grounded (as in FIGS. 1, 8, 9 and 10), the gain in the flat characteristic curve can be made completely constant by setting the movable contact at the mechanical center of the variable resistor. Furthermore, it is possible to select the variable resistor so that the above-described flat characteristic curve can be obtained with the movable contact set at the mechanical center of the variable resistor (cf. FIG. 16). Although special variable resistors and switches are required for the NF type tone control circuit, such elements are not required for the tone control circuit of this invention. With the flat characteristic curve, the control of the gain can be readily controlled.

What is claimed is:

1. A tone control circuit comprising:
an amplifier having a non-inverting input terminal, an inverting input terminal and an output terminal, said non-inverting terminal being an input terminal to said tone control circuit,
a bass control circuit including a first variable resistor having a movable contact connected to output terminal of said amplifier, a first resistor connected between one end of said first variable resistor and said inverting input terminal, a second resistor connected between the other end of said first variable resistor and an output terminal of said tone control circuit, the resistances of said first and second resistors being equal, and capacitance means connected in parallel with said first variable resistor, a treble control circuit including a second variable resistor and connected in parallel with said bass control circuit, and a gain control circuit including a third variable resistor connected between said first resistor and ground, said third variable resistor having a movable contact connected to said inverting input terminal of said amplifier.

2. A tone control circuit as recited in claim 1 wherein, said second variable resistor has a center tap connected to ground and said treble control circuit further comprises:

a first capacitor connected to a movable contact of said second variable resistor, and a third resistor connected in series between said first capacitor and ground.

3. A tone control circuit as recited in claim 1 wherein said second variable resistor having a movable contact connected to ground and said treble control circuit further comprises:

first and second capacitors respectively connected to opposite ends of said second variable resistor, the capacitances of said first and second capacitors being equal, and third and fourth resistors connected in series with said first and second capacitors, respectively, said third resistor being connected to said inverting input terminal of said amplifier and said fourth resistor being connected to the output terminal of said tone control circuit, the resistances of said third and fourth resistors being equal.

4. A tone control circuit as recited in claim 1 wherein said second variable resistor has a movable contact and said capacitance means comprises a first capacitor connected between the two ends of said first variable resistor, said movable contact of said second variable resistor is connected to ground and said treble control circuit further comprises:

second and third capacitors respectively connected to opposite ends of said second variable resistor, the capacitances of said second and third capacitors being equal, and third and fourth resistors connected in series with said second and third capacitors, respectively, said third resistor being connected to said inverting input terminal of said amplifier and said fourth resistor being connected to the output terminal of said tone control circuit, the resistances of said third and fourth resistors being equal.

* * * * *